(12) United States Patent
Takei et al.

(10) Patent No.: US 7,685,489 B2
(45) Date of Patent: Mar. 23, 2010

(54) SEMICONDUCTOR INTEGRATED CIRCUIT AND TESTING METHOD

(75) Inventors: Kazuhiro Takei, Kawasaki (JP); Koichi Otsuki, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 219 days.

(21) Appl. No.: 11/902,695

(22) Filed: Sep. 25, 2007

(65) Prior Publication Data

US 2008/0086665 A1    Apr. 10, 2008

(30) Foreign Application Priority Data

Oct. 4, 2006    (JP)    ............................. 2006-273370

(51) Int. Cl.
*G01R 31/28* (2006.01)

(52) U.S. Cl. ........................ 714/727; 714/733; 714/731; 714/744; 714/700; 714/724; 714/25; 714/30; 714/707; 714/716; 714/717; 714/726; 714/729; 714/814; 324/765; 324/158.1

(58) Field of Classification Search ........................ None
See application file for complete search history.

(56) References Cited

U.S. PATENT DOCUMENTS

| | | | | | |
|---|---|---|---|---|---|
| 5,621,739 | A | * | 4/1997 | Sine et al. | 714/724 |
| 5,675,265 | A | * | 10/1997 | Yamamori | 327/3 |
| 6,477,674 | B1 | * | 11/2002 | Bates et al. | 714/738 |
| 6,671,847 | B1 | * | 12/2003 | Chao et al. | 714/744 |
| 7,036,055 | B2 | * | 4/2006 | Muljono et al. | 714/716 |
| 7,089,470 | B1 | * | 8/2006 | Baeg et al. | 714/727 |
| 7,308,628 | B2 | * | 12/2007 | Spirkl et al. | 714/724 |
| 7,363,551 | B2 | * | 4/2008 | Muljono | 714/700 |
| 2002/0011865 | A1 | * | 1/2002 | Takagi et al. | 324/765 |
| 2003/0011396 | A1 | * | 1/2003 | Takagi | 324/765 |
| 2003/0229828 | A1 | * | 12/2003 | Muljono et al. | 714/700 |
| 2007/0079200 | A1 | * | 4/2007 | Tabatabaei et al. | 714/733 |
| 2008/0001616 | A1 | * | 1/2008 | Abraham et al. | 324/765 |
| 2008/0010573 | A1 | * | 1/2008 | Sul | 714/731 |
| 2009/0119557 | A1 | * | 5/2009 | Whetsel | 714/727 |

FOREIGN PATENT DOCUMENTS

JP    H08-062298    3/1996
JP    H10-026654    1/1998

OTHER PUBLICATIONS

Korean Office Action dated Aug. 31, 2009, 8 pages.

* cited by examiner

*Primary Examiner*—John P Trimmings
(74) *Attorney, Agent, or Firm*—Arent Fox LLP (57) ABSTRACT

A semiconductor integrated circuit includes: an input/output cell that is included in a path captured during propagation delay testing and that has an output-stage buffer on an output bus; and a terminal connected to the output bus and an input bus of the input/output cell. An external load or a testing device is connectable to the terminal. The input/output cell has a switching part that is capable of switching between a first path that loops back at an output side of the output-stage buffer and a second path that loops back at an input side of the output-stage buffer. The first path is selected during normal operation and the second path is selected during the propagation delay testing.

14 Claims, 8 Drawing Sheets

SEMICONDUCTOR INTEGRATED CIRCUIT AND TESTING METHOD

BACKGROUND

1. Field

The embodiments relates to semiconductor integrated circuits and testing methods.

2. Description of the Related Art

Figure 1:
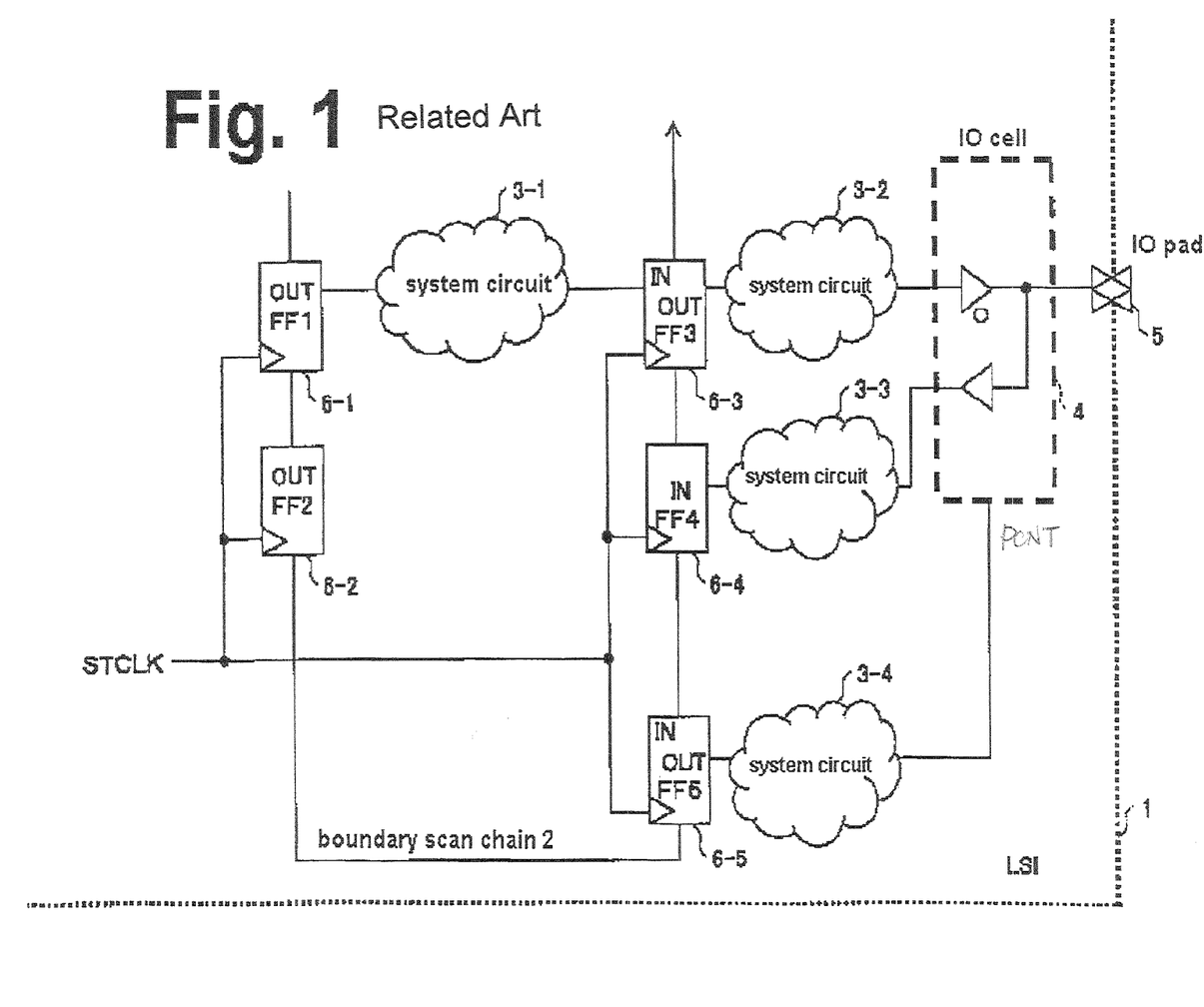
FIG. 1 is a diagram showing a major portion of one example of a known semiconductor integrated circuit.

FIG. 1 is a diagram showing a major portion of one example of a known semiconductor integrated circuit. As shown in FIG. 1, an LSI (large scale integrated) circuit 1 has a boundary scan chain 2, system circuits 3-1 to 3-4, an input/output (IO) cell 4, and an IO pad 5. The boundary scan chain 2 has flip flops (FF1 to FF5) 6-1 to 6-5 that constitute a register (or a boundary scan register) for realizing a boundary scan testing function. A scan test clock STCLK is input to clock input terminals of the flip flops 6-1 to 6-5, and a path control signal PCNT is input from the flip flop 6-5 to a control terminal of the IO cell 4 via the system circuit 3-4. An external load (not shown) is connected between the IO pad 5 and ground.

In propagation delay testing (or transition delay testing), a high-speed, i.e., a short-duration, scan test clock STCLK is input to detect a propagation delay failure in the data path of the flip flops 6-1 to 6-5. The scan test clock STCLK has a frequency of, for example, about 100 MHz. A path captured during such propagation delay testing includes, for example, the system circuits 3-1 to 3-3 and the IO cell 4.

Figure 2:
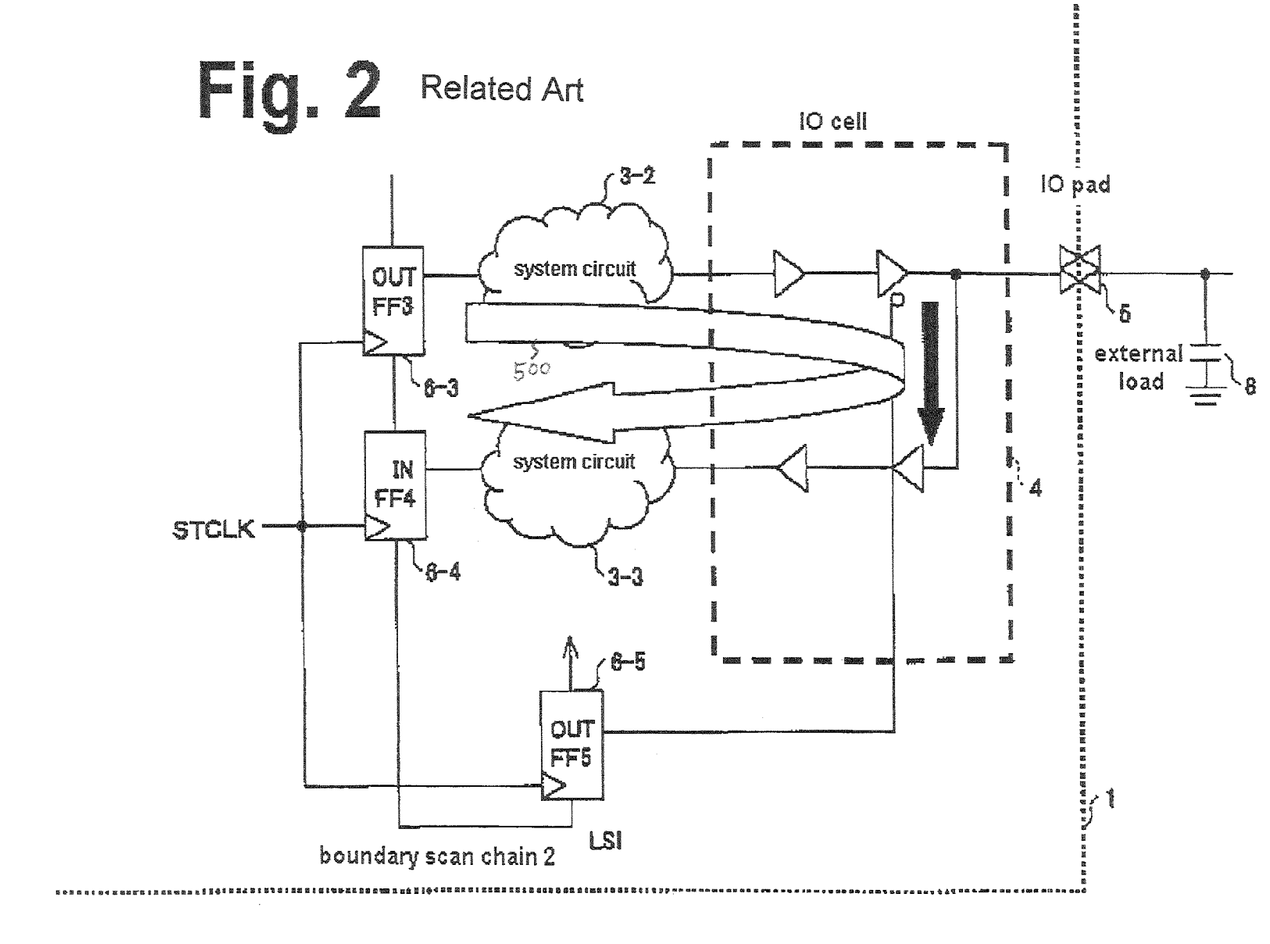
FIG. 2 is a diagram showing a known IO cell and its peripheral structure.

FIG. 2 is a diagram showing a known IO cell and its peripheral structure. As shown in FIG. 2, when a path 500 including an IO cell 4 is to be subjected to propagation delay testing, an influence of an external load 8 during the testing of the LSI circuit 1, i.e., a load (capacity) of a testing device, appears as path delay and signal reflection, as indicated by the black arrow, since the IO cell 4 exists along the path 500. Since the load of the testing device is larger than the external load 8 during normal operation of the LSI circuit 1, the amount of time of delay in the path 500 including the IO cell 4 during the testing is also larger than the amount of time of delay in the path 500 during the normal operation. Thus, the delay acts as a factor for reducing the operating frequency of the propagation delay testing. In FIG. 2, the path 500 captured during the propagation delay testing includes the system circuits 3-2 and 3-3, and the flip flop 6-3 serves as the start point of the path 500 and the flip flop 6-4 serves as the end point of the path 500.

For example, Japanese Unexamined Patent Application Publication No. 8-62298 discloses a semiconductor integrated circuit having a selector that loops back input data of a high-speed interface to an output section. Japanese Unexamined Patent Application Publication No. 10-26654 discloses a technology in which an input characteristic of a terminal having an input function is tested independently of the state of another input terminal and the logic of an internal circuit.

The known semiconductor integrated circuits, however, have a problem in that it is difficult to perform propagation delay testing without influence of an external load.

SUMMARY

The embodiment provided that a semiconductor integrated circuit including an input/output cell that is included in a path captured during propagation delay testing and that has an output-stage buffer on an output bus, and a terminal connected to the output bus and an input bus of the input/output cell, and being connectable to an external load or a testing device, wherein the input/output cell has switching part that switches between a first path that loops back at an output side of the output-stage buffer and a second path that loops back at an input side of the output-stage buffer, and the first path is selected during normal operation and the second path is selected during the propagation delay testing.

DESCRIPTION OF THE EMBODIMENTS

In a semiconductor integrated circuit, an input/output (IO) cell has switching part that is capable of switching between a first path that loops back at an output side of an output-stage buffer and a second path that loops back at an input side of the output-stage buffer. The first path that loops back at the output side of the output-stage buffer is selected during normal operation, and the second path that loops back the input side of the output-stage buffer is selected during propagation delay testing.

With this arrangement, the propagation delay testing can be performed without the influence of an external load. Further, it is possible to suppress the influence of the external load from appearing as path delay and signal reflection in a path including the input/output cell, and it is also possible to suppress an influence on the testing speed, the influence resulting from the load (capacity) of the connected testing device.

A semiconductor integrated circuit and a testing method according to embodiments will be described below with reference to FIGS. 3 to 8.

First Embodiment

Figure 3:
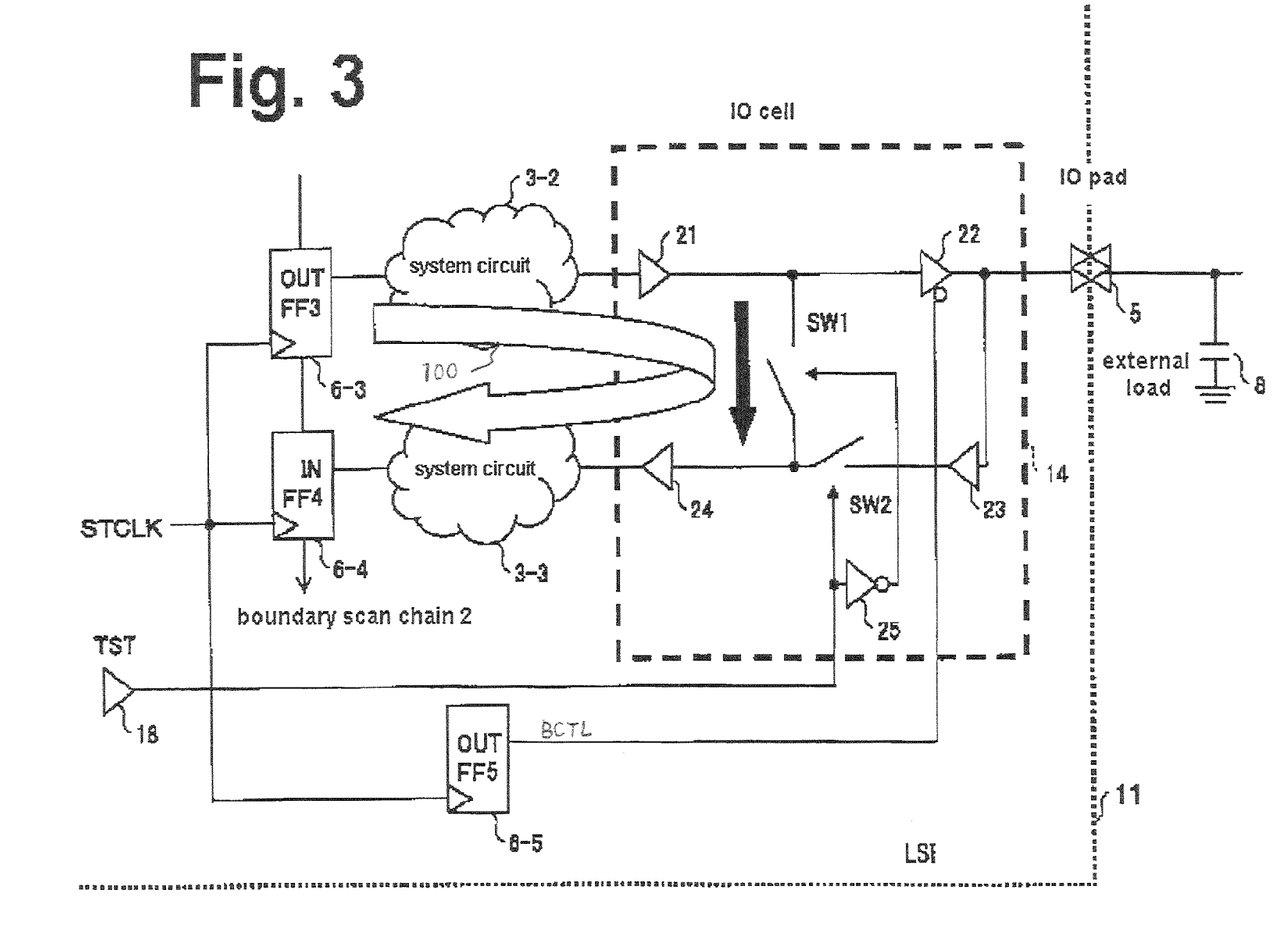
FIG. 3 is a diagram showing a major portion of a semiconductor integrated circuit according to a first embodiment.

FIG. 3 is diagram showing a major portion of a semiconductor integrated circuit according to a first embodiment. In FIG. 3, the same sections as those in FIGS. 1 and 2 are denoted by the same reference numerals, and the descriptions thereof are not given below. An LSI circuit 11 is provided on a single substrate of a semiconductor device. A test signal TST indicating propagation delay testing is input from inside or outside the LSI circuit 11 to a control pad (or a control terminal) 18.

An IO cell 14 has an output bus to an IO pad 5 and an input bus from the IO pad 5. The output bus has a pre-buffer 21 included in an input stage and a final buffer 22 included in an output stage. The input bus has a pre-buffer 23 included in an input stage and a final buffer 24 included in an output stage. The buffer 22 is controlled by a bus control signal BCTL output from a flip flop (FF5) 6-5. A node on the output bus, which connects the buffers 21 and 22, and a node on the input bus, which connects the buffers 23 and 24, are connected via a switching section SW1. On the input bus, the buffer 23 and a node that connects the switching section SW1 and the input bus are connected via a switching section SW2. The on/off (open/closed) state of the switching section SW1 is controlled by a test signal TST (an inverted test signal/TST) supplied from the control pad 18 via an inverter 25. The on/off state of the switching section SW2 is controlled by the test signal TST supplied from the control pad 18. The switching sections SW1 and SW2 and the inverter 25 constitute switching part.

During normal operation of the LSI circuit 11, the switching section SW1 is controlled to be turned off and the switching section SW2 is controlled to be turned on in response to the test signal TST. On the other hand, during the propagation delay testing of the LSI circuit 11, the switching section SW1 is controlled to be turned on and the switching section SW2 is turned off in response to the test signal TST. With this arrangement, when a path 100 including the IO cell 14 is to be subjected to propagation delay testing, an influence of an external load 8 during the testing of the LSI circuit 11, that is, a load (capacity) of a testing device does not appear as path delay and signal reflection, as indicated by the black arrow, although the IO cell 14 exists along the path 100. The load of the testing device is greater than the external load 8 applied during the normal operation of the LSI circuit 11. However, the delay of the path 100 including the IO cell 14 during the testing is substantially the same as the delay of the path 100 during the normal operation, and thus does not act as a factor for reducing the operating frequency of the propagation delay testing. In FIG. 3, the path 100 captured during the propagation delay testing includes system circuits 3-2 and 3-3 and the IO cell 14, and a flip flop 6-3 serves as the start point of the path 100 and the flip flop 6-4 serves as the end point of the path 100.

As described above, the IO cell 14 has a configuration that is capable of switching between a path passing through the switching section SW1 that loops back at the input side of the output-stage buffer 22 and a path passing through the switching section SW2 that loops back at the output side of the output-stage buffer 22. During the normal operation, the path that loops back the output side of the output-stage buffer 22 is selected, and during the propagation delay testing, the path that loops back at the input side of the output-stage buffer 22 selected. Thus, the propagation delay testing can be performed without the influence of the external load 8. Further, it is possible to suppress the influence of the external load 8 from appearing as path delay and signal reflection in the path 100 including the IO cell 14, and it is also possible to suppress an influence on the testing speed, the influence resulting from the load (capacity) of the connected testing device.

The embodiment can achieve a semiconductor integrated circuit and a testing method which allows propagation delay testing to be performed without influence of an external load.

Figure 4:
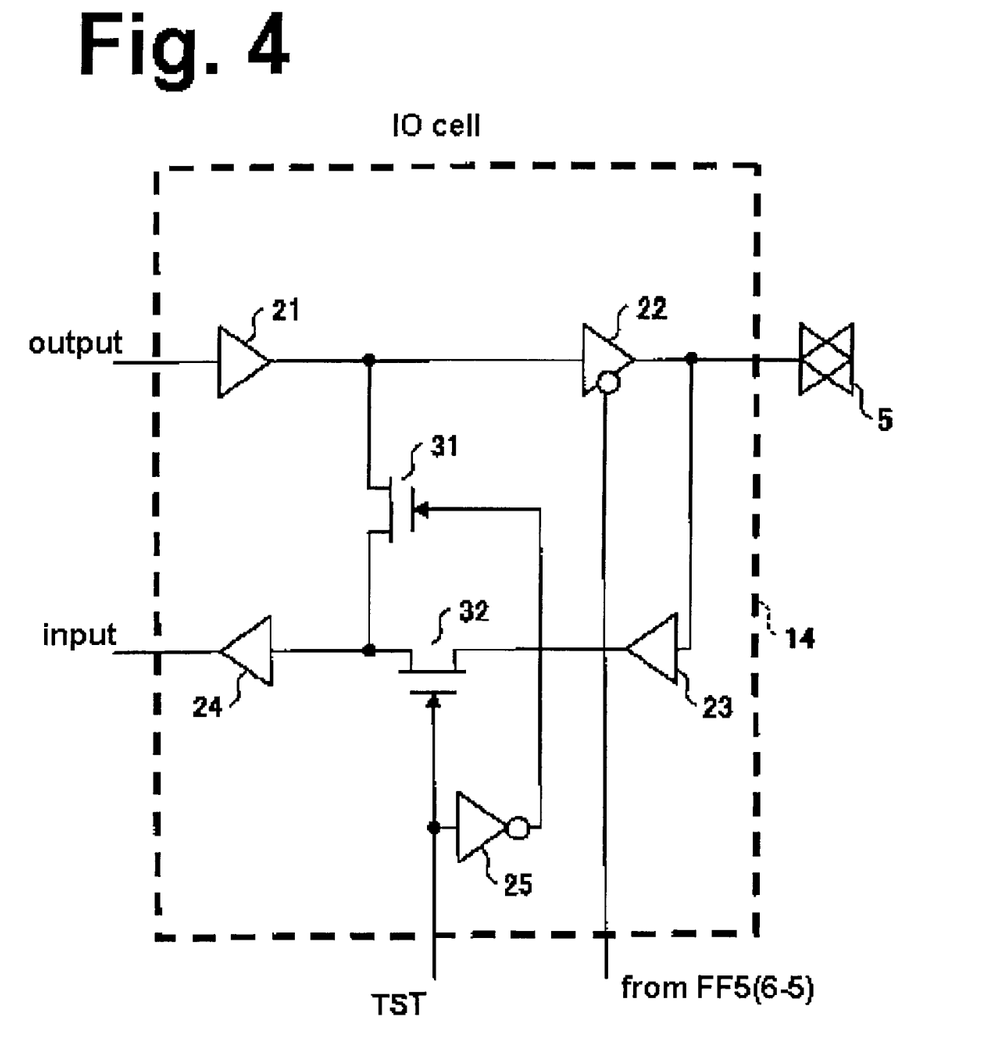
FIG. 4 is a diagram showing another configuration of the IO cell.

FIG. 4 is a diagram showing another configuration of the IO cell 14. In FIG. 4, the switching section SW1 includes a transistor 31 and the switching section SW2 includes a transistor 32. The transistors 31 and 32 and the inverter 25 constitute switching part.

Figure 5:
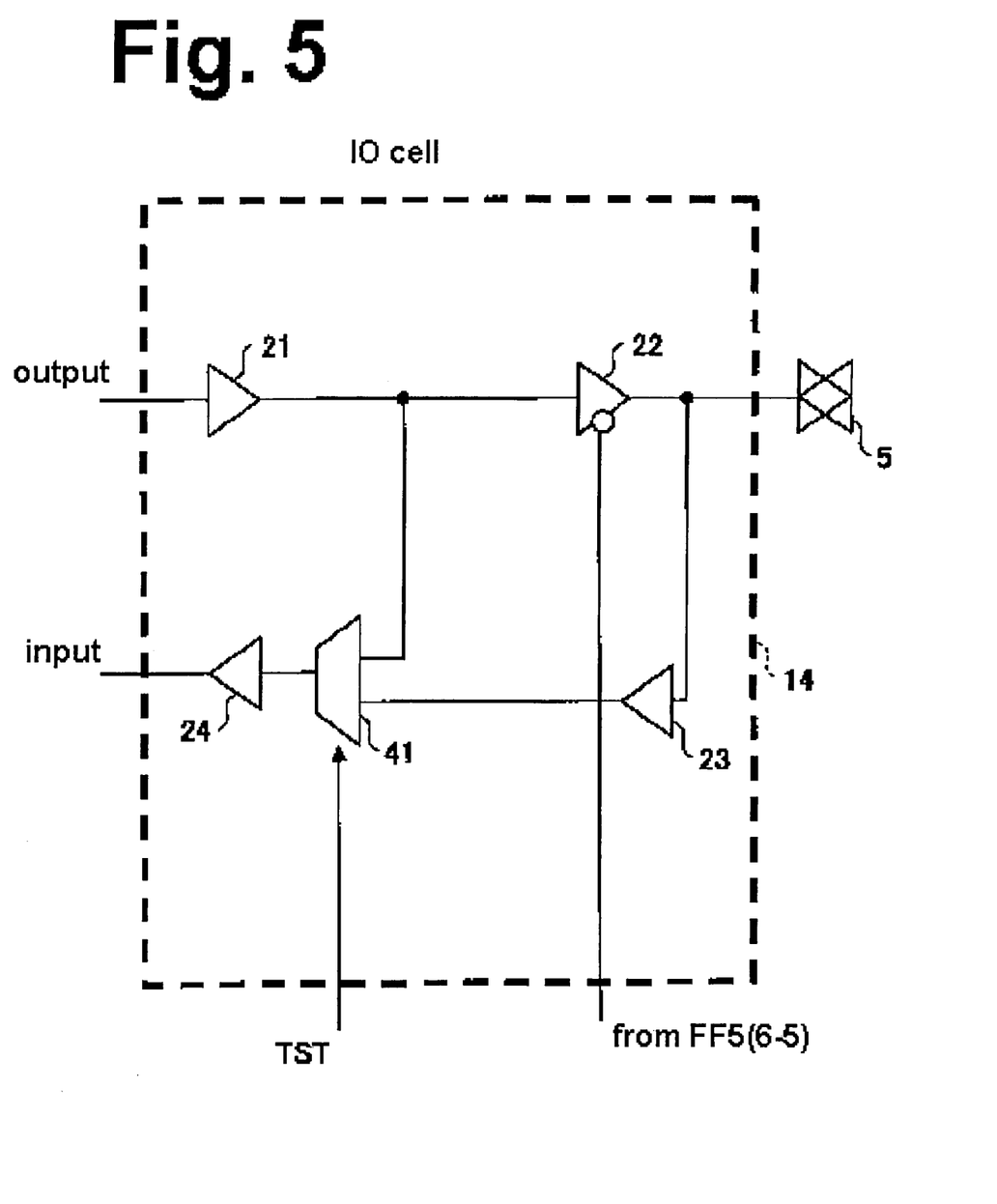
FIG. 5 is a diagram showing another configuration of the IO cell.

FIG. 5 is a diagram showing another configuration of the IO cell 14. In FIG. 5, the function of the switching sections SW1 and SW2 and the inverter 25 is achieved by a selector 41. An output of the buffer 21 and an output of the buffer 23 are input to input terminals of the selector 41. The test signal TST supplied from the control pad 18 is input to a select terminal of the selector 41. During the normal operation of the LSI circuit 11, the selector 41 is controlled so as to select and output the output of the buffer 21, in response to the test signal TST. On the other hand, during the propagation delay testing of the LSI circuit 11, the selector 41 is controlled so as to select and output of the output of the buffer 23, in response to the test signal TST. The selector 41 serves as the switching part.

Figure 6:
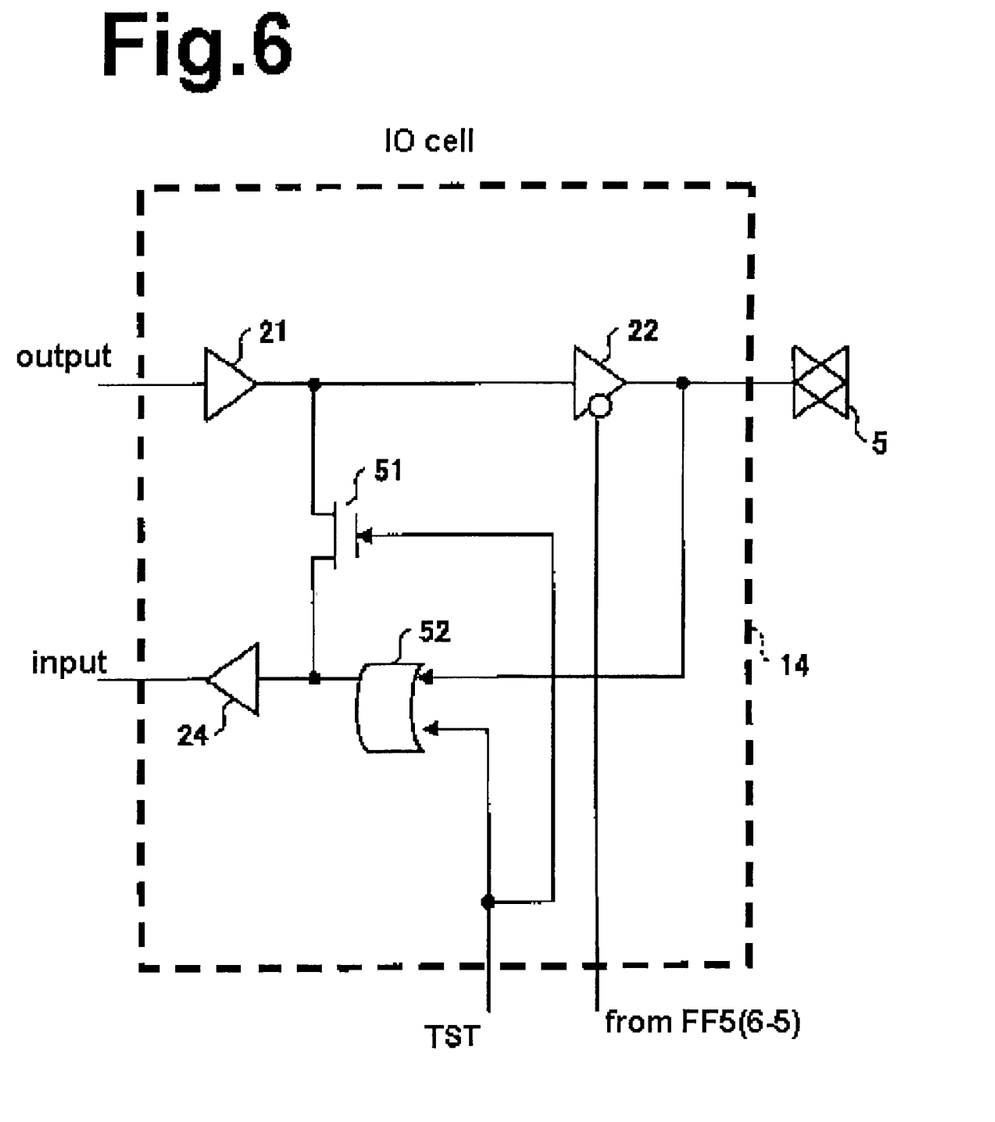
FIG. 6 is a diagram showing yet another configuration of the IO cell.

FIG. 6 is yet another configuration of the IO cell 14. In FIG. 6, the function of the switching sections SW1 and SW2 and the inverter 25 is achieved by a transistor 51 and an OR circuit 52, and the buffer 23 is not provided. The transistor 51 is provided between the output of the buffer 21 and the input of the buffer 24, and the on/off state of the transistor 51 is controlled by the test signal TST. The output of the buffer 22 is input to one of input terminals of the OR circuit 52 and the test signal TST is input to the other input terminal of the OR circuit 52. During the normal operation of the LSI circuit 11, the transistor 51 is controlled to be turned off in response to the test signal TST and the output of the buffer 22 is output from the OR circuit 52. On the other hand, during the propagation delay testing of the LSI circuit 11, the transistor 51 is controlled to be turned on in response to the test signal TST and the output of the test buffer 22 is not output from the OR circuit 52. The transistor 51 and the OR circuit 52 constitute the switching part.

Second Embodiment

Figure 7:
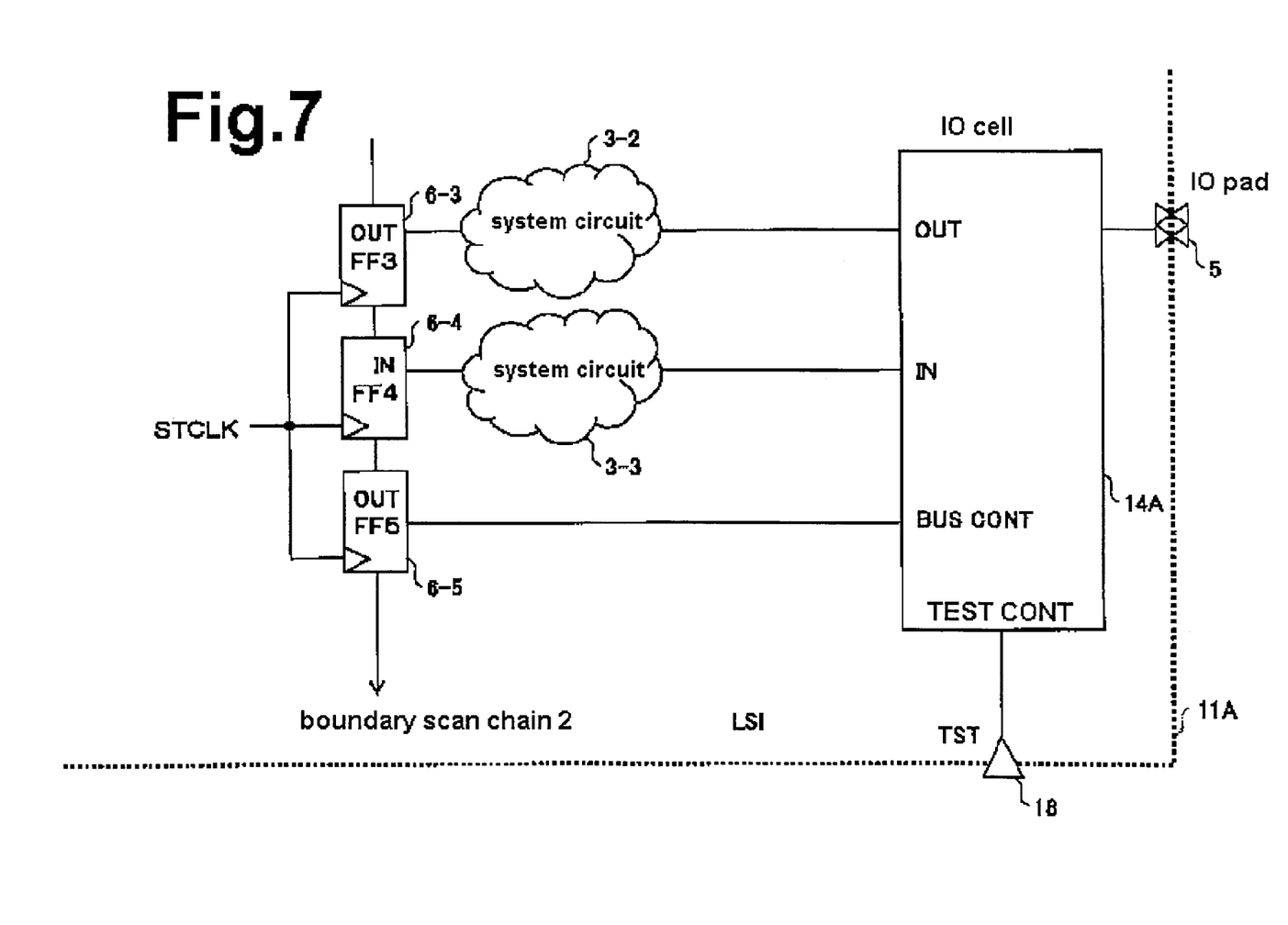
FIG. 7 is a diagram showing a major portion of a semiconductor integrated circuit according to a second embodiment.

FIG. 7 is a diagram showing a major portion of a semiconductor integrated circuit according to a second embodiment. In FIG. 7, the same sections as those in FIG. 3 are denoted by the same reference numerals, and the descriptions thereof are not given below. In FIG. 7, an LSI circuit 11A is provided with a control pad (or a test terminal) 18 dedicated for propagation delay testing, and the test signal TST is input from the control pad 18 to an IO cell 14A.

The semiconductor integrated circuit according to a second embodiment, which allows propagation delay testing to be performed without influence of an external load.

Third Embodiment

Figure 8:
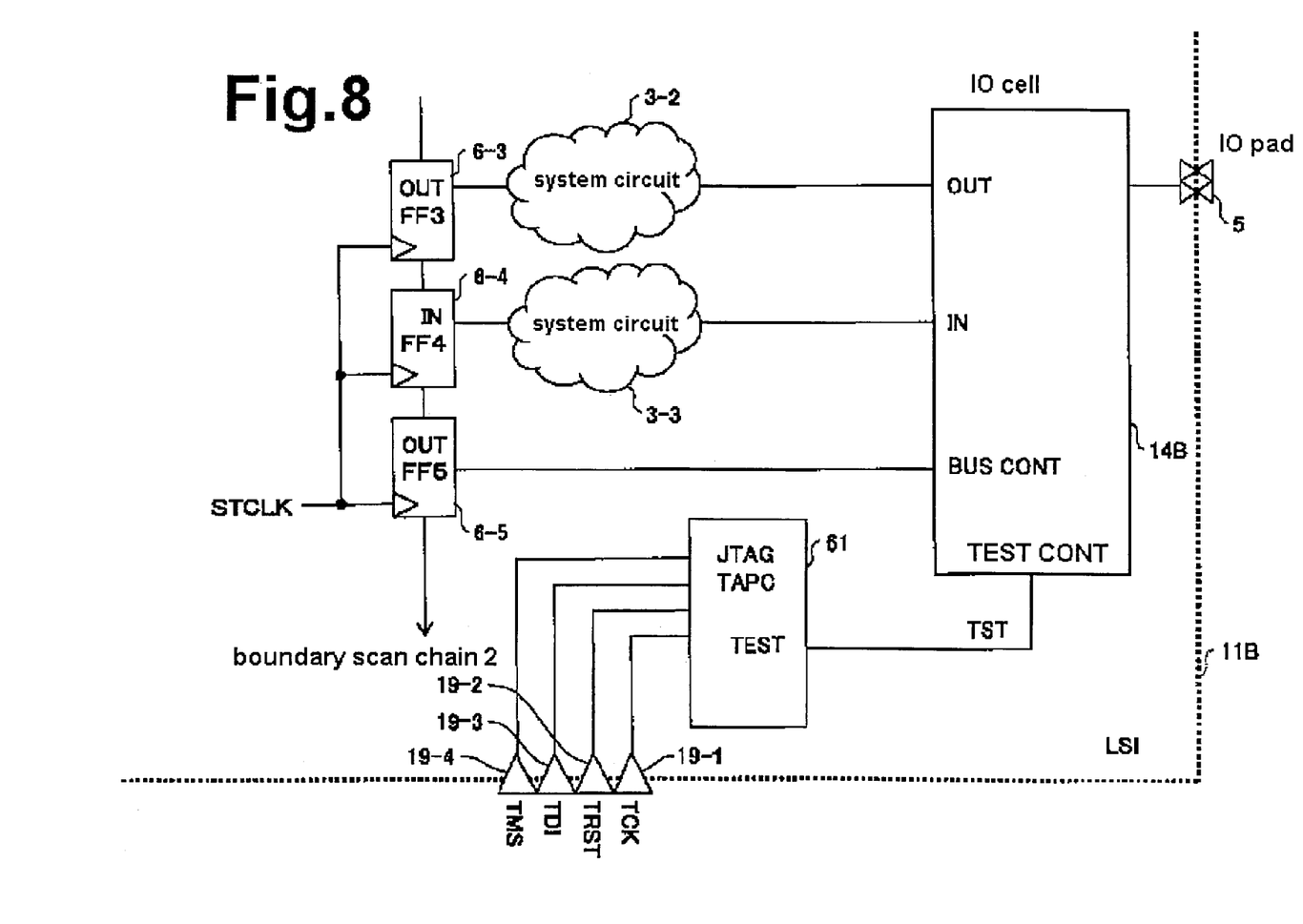
FIG. 8 is a diagram showing a major portion of a semiconductor integrated circuit according to a third embodiment.

FIG. 8 is a diagram showing a major portion of a semiconductor integrated circuit according to a third embodiment. In FIG. 8, the same sections as those in FIG. 3 are denoted by the same reference numerals, and the descriptions thereof are not given below. In FIG. 8, the test signal TST is generated by a section provided in an LSI circuit 11B and is input to an IO cell 14B. Specifically, the test signal TST is generated by a JTAG TAPC (Joint Test Action Group-Test Access Port Controller) 61 that is provided in the LSI circuit 11B and that is compliant with IEEE std 1149.1 Standard Test Access Port and Boundary-Scan Architecture. The JTAG TAPC 61 controls a register for realizing a boundary scan testing function, i.e., a boundary scan register including flip flops 6-3 to 6-5. The JTAG TAPC 61 generates the test signal TST based on signals TCK, TRST, TDI, and TMS input from pads (or terminals) 19-1 to 19-4 of the LSI circuit 11B. For the JTAG TAPC 61, five signals TCK, TMS, TDI, TDO, and TRST are prepared to set data for the register and to control the JTAG TAPC 61. The above-mentioned signals TCK, TRST, TDI, and TMS are four signals of the five signals, and the above-described test signal TST corresponds to the output signal TDO. The signal TCK is a system clock (Test Clock input) for a serial data bus that connects system circuits (or devices), and the test operation and the normal operation of the LSI circuit 11B are performed in synchronization with the system clock TCK. The signal TMS is an input signal (Test Mode Select input) for controlling a test logic. The signal TDI is a serial input signal (Test Data Input) for an instruction and data for the test logic. The signal TDO is a serial output signal (Test Data Output) for data from the test logic. The signal TRST is an input signal for performing asynchronous reset of the JTAG TAPC 61 and is optional.

The embodiment encompasses the scope of the embodiment described below.

The semiconductor integrated circuit according to a third embodiment, which allows propagation delay testing to be performed without influence of an external load.

Although the present invention has been described in conjunction with the particular embodiments, it goes without saying that the present invention is not limited thereto and various modifications and improvements can be made without departing from the spirit and scope of embodiments.

What is claimed is:

1. A semiconductor integrated circuit comprising:
    an input/output cell that is included in a path captured during propagation delay testing and that has an output-stage buffer on an output bus; and
    a terminal coupled to the output bus and an input bus of the input/output cell, and being connectable to an external load or a testing device,
    wherein the input/output cell has a switching part that is switched between a first path that loops back at an output side of the output-stage buffer and a second path that loops back at an input side of the output-stage buffer,
    wherein, during the normal operation, the switching part selects the first path and does not select the second path, and
    wherein, during the propagation delay testing, the switching part selects the second path and does not select the first path.

2. The semiconductor integrated circuit according to claim 1, wherein the switching part switches between the first path and the second path in response to a test signal input from inside or outside the semiconductor integrated circuit.

3. The semiconductor integrated circuit according to claim 1, further comprising:
    a boundary scan chain including multiple flip flops,
    wherein a start point and an end point of the path captured during the propagation delay testing comprise two different flip flops in the boundary scan chain.

4. The semiconductor integrated circuit according to claim 2, further comprising:
    a boundary scan chain including multiple flip flops,
    wherein a start point and an end point of the path captured during the propagation delay testing comprise arbitrary two different flip flops in the boundary scan chain.

5. The semiconductor integrated circuit according to claim 2, further comprising:
    a TAPC (Test Access Port Controller) that generates the test signal and that is compliant with IEEE std 1149.1 Standard Test Access Port and Boundary-scan Architecture.

6. A semiconductor integrated circuit comprising:
    an input/output cell that is included in a path captured during propagation delay testing and that has an output-stage buffer provided on an output bus;
    a terminal coupled to the output bus and an input bus of the input/output cell, and being connectable to an external load or a testing device;
    an input-stage buffer provided on the output bus; and
    an output-stage buffer provided on the input bus,
    wherein the input/output cell has a switching part that is switching between a first path that loops back at an output side of the output-stage buffer and a second path that loops back at an input side of the output-stage buffer, and the first path is selected during normal operation and the second path is selected during the propagation delay testing,
    wherein the first path comprises the input-stage buffer and the output-stage buffer that are provided on the output bus and the output-stage buffer provided on the input bus, and
    the second path comprises only the input-stage buffer on the output bus and the output-stage buffer on the input bus.

7. The semiconductor integrated circuit according to claim 6, further comprising:
    an input-stage buffer provided on the input bus,
    wherein the first path comprises the input-stage buffer and the output-stage buffer that are provided on the output bus and input-stage buffer and the output-stage buffer that are provided on the input bus, and
    the second path comprises only the input-stage buffer on the output bus and the output-stage buffer on the input bus.

8. The semiconductor integrated circuit according to claim 6,
    wherein the output-stage buffer on the output bus is controlled by an output of a flip flop in the boundary scan chain.

9. The semiconductor integrated circuit according to claim 6,
    wherein the output-stage buffer on the output bus is controlled by an output of a flip flop in the boundary scan chain.

10. A test method for a semiconductor integrated circuit, wherein the semiconductor integrated circuit includes an input/output cell that is included in a path captured during propagation delay testing and that has an output-stage buffer on an output bus and terminal coupled to the output bus and an input bus of the input/output cell, and being connectable to an external load or a testing device, and a switching part, the test method comprising:
    controlling the switching part in the output/input cell in a manner that a first path, which loops back at an output side of the output-stage buffer, is selected during normal operation and a second path, which loops back at an input side of the output-stage buffer, is not selected during a normal operation, and the second path is selected and the first path is not selected during the propagation delay testing.

11. The testing method according to claim 10, wherein a test signal is input from inside or outside the semiconductor integrated circuit to cause the second path to be selected during the propagation delay testing.

12. The testing method according to claim 10, wherein the semiconductor integrated circuit comprises a boundary scan chain including multiple flip flops, and
    a start point and an end point of the path captured during the propagation delay testing comprise two different flip flops in the boundary scan chain.

13. The testing method according to claim 11, wherein the semiconductor integrated circuit comprises a boundary scan chain including multiple flip flops, and
    a start point and an end point of the path captured during the propagation delay testing comprise two different flip flops in the boundary scan chain.

14. The testing method according to claim 11, wherein the test signal is generated by a TAPC (Test Access Port Controller) that is provided in the semiconductor integrated circuit and that is compliant with IEEE std 1149.1 Standard Test Access Port and Boundary-Scan Architecture.

* * * * *